(12) United States Patent
Horner et al.

(10) Patent No.: US 12,244,258 B2
(45) Date of Patent: Mar. 4, 2025

(54) HIGH-INTEGRITY ACTUATOR CONTROLLER AND CONTROL SYSTEMS

(71) Applicant: HONEYWELL INTERNATIONAL INC., Charlotte, NC (US)

(72) Inventors: Darrell Horner, Oro Valley, AZ (US); Ronald Vaughan, Chandler, AZ (US); Dean Wilkens, Scottsdale, AZ (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 157 days.

(21) Appl. No.: 18/152,803

(22) Filed: Jan. 11, 2023

(65) Prior Publication Data

US 2023/0291336 A1  Sep. 14, 2023

Related U.S. Application Data

(60) Provisional application No. 63/269,077, filed on Mar. 9, 2022.

(51) Int. Cl.
*H02P 6/24* (2006.01)
*H02P 101/30* (2015.01)
*H03K 7/08* (2006.01)

(52) U.S. Cl.
CPC .............. *H02P 6/24* (2013.01); *H03K 7/08* (2013.01); *H02P 2101/30* (2015.01)

(58) Field of Classification Search
CPC .......... H02P 6/24; H02P 2101/30; H03K 7/08
USPC ........................................................ 318/362
See application file for complete search history.

(56) References Cited

U.S. PATENT DOCUMENTS

| 9,327,825 | B2 | 5/2016 | White et al. |
| 10,394,241 | B2 | 8/2019 | Debouk et al. |
| 10,483,880 | B2 | 11/2019 | Peck, Jr. et al. |
| 10,901,434 | B2 | 1/2021 | Cutler et al. |
| 11,063,577 | B2 | 7/2021 | Vulpoiu et al. |
| 11,155,341 | B2 | 10/2021 | Wilkens |
| 2006/0113952 | A1* | 6/2006 | Zhou ............... H02P 25/024 318/801 |
| 2009/0128072 | A1* | 5/2009 | Strong ............... H02P 6/14 318/400.17 |

FOREIGN PATENT DOCUMENTS

| CN | 113048091 B | 5/2022 |
| KR | 101704406 B1 | 2/2017 |
| WO | WO-2013137244 A1 * | 9/2013 ........... B62D 5/0463 |

* cited by examiner

*Primary Examiner* — Kawing Chan
(74) *Attorney, Agent, or Firm* — Lorenz & Kopf LLP (57) ABSTRACT

A high-integrity electromechanical actuator control system includes a system function controller, a plurality of actuator controllers, and at least one electromechanical actuator. Each actuator controller includes a first controller, a second controller, and a duty cycle computation circuit. The first controller receives digital actuator control commands supplied from two of the function control channels and supplies first digital duty cycle commands. The second controller receives digital actuator control commands supplied from two function control channels and supplies second digital duty cycle commands. The duty cycle computation circuit receives the first digital duty cycle commands and the second digital duty cycle commands, computes an average of the first and second duty cycle commands, and generates pulse width modulated (PWM) commutation control signals based on the computed average.

15 Claims, 7 Drawing Sheets

HIGH-INTEGRITY ACTUATOR CONTROLLER AND CONTROL SYSTEMS

CROSS REFERENCE TO RELATED APPLICATION

The present application claims benefit of U.S. Provisional Patent Application No. 63/269,077, filed Mar. 9, 2022, which is hereby incorporated by reference herein in its entirety.

TECHNICAL FIELD

The present disclosure generally relates to aircraft actuation control, and more particularly relates to a high integrity actuator controller and control system that provide mitigation against common mode failures.

BACKGROUND

Modern aircraft are evolving to a more electric architecture for actuation control. For example, flight control surface control, engine tilt control, propeller pitch control, and numerous other control systems are adopting a more electric control architecture. This type of architecture uses electromechanical actuators (EMAs) with electromechanical motors. The EMAs are controlled by electromechanical actuator controllers (EMACs).

Some aircraft actuation systems are flight critical and thus require high integrity EMA control to prevent loss of control or erroneous control. Because of this flight criticality, EMACs, which contain electronic circuitry and software, must adhere to various industry standards. Some examples of industry standards include SAE ARP4754A (Guidelines for Development of Civil Aircraft Systems), SAE ARP4761 (Guidelines and Methods for Conducting the Safety Assessment Process on Civil Airborne Systems and Equipment), and AC/AMC 20-152A (Development Assurance for Airborne Electronic Hardware (AEH)). Each of these industry standards provides varied guidance.

For example, SAE ARP4754A establishes guidance for "Development Assurance," and as one means of achieving these objectives, introduces the use of "independence" (between design elements) as a strategy to overcome systemic errors in the development or production of a product. SAE ARP4761 describes the use of fault trees, and "independence" to overcome common cause and common mode failures (that could bypass redundancy). And AC/AMC 20-152A provides certification guidance for the use of commercially available off-the-shelf (COTS) electronic devices and provides a definition of "complex" versus "simple" devices. This standard further establishes that complex devices may need mitigation at the hardware, software, or system level to prevent inadvertent alteration of "critical configuration settings" of the complex COTS device to prevent an undesired failure.

To achieve suitable levels of safety when operating a single controlled device/system (e.g., surfaces, engine, or other), it is assumed that the device/system must be controlled by a high integrity EMAC and EMA where erroneous control by common mode failure is mitigated.

Or, to achieve the suitable level of safety to prevent loss of control, it is assumed that system functional redundancy is required. Such redundancy can be achieved either by multiple redundant control devices/systems (e.g., surfaces, engines, other) to achieve a given function, or by control redundancy to individual devices/systems.

As a result, high integrity EMACs can require the control system to contain one or more of the following system/design features: (1) redundant control system commands for availability; (2) independent command versus monitoring architecture in the control system; (3) redundancy to ensure that one EMAC failure can be mitigated by a backup EMAC; (4) EMAC dissimilarity (independence) to ensure that both EMACs do not fail at the same time due to a common failure; (5) high integrity EMAC command of the EMA position; and (6) independence within the EMAC electronics to assure the ability to shut-off control around a misbehaving complex AEH in the event of a detected failure.

Each of the above system/design features can result in a relatively heavy, complex, and costly system—both in design and production. Hence, there is a need for a highly efficient EMAC system architecture that meets industry standards for flight critical actuation systems, while exhibiting less weight, complexity, and cost as compared to presently known architectures. The present invention addresses at least this need.

BRIEF SUMMARY

This summary is provided to describe select concepts in a simplified form that are further described in the Detailed Description. This summary is not intended to identify key or essential features of the claimed subject matter, nor is it intended to be used as an aid in determining the scope of the claimed subject matter.

In one embodiment, a high-integrity electromechanical actuator control system includes a system function controller, a plurality of actuator controllers, and at least one electromechanical actuator. The system function controller includes a plurality of redundant function control channels, and each function control channel is configured to supply digital actuator control commands. Each actuator controller is coupled to receive the digital actuator control commands supplied from at least two of the function control channels. Each actuator controller is configured, upon receipt of the actuator control commands, to implement a command voting scheme to verify actuator control command integrity and, upon verifying actuator control command integrity, to generate and supply analog actuator position commands. Each electromechanical actuator is coupled to receive the actuator position commands from at least one of the actuator controllers and is configured, upon receipt thereof, to actuate a device. Each actuator controller includes a first controller, a second controller, and a duty cycle computation circuit. The first controller is coupled to receive the digital actuator control commands supplied from two of the function control channels and is configured, upon receipt thereof, to supply first digital duty cycle commands. The second controller is coupled to receive the digital actuator control commands supplied from two of the function control channels and is configured, upon receipt thereof, to supply second digital duty cycle commands. The duty cycle computation circuit coupled to receive the first digital duty cycle commands and the second digital duty cycle commands and is configured, upon receipt of the first and second duty cycle commands to (i) compute an average of the first and second duty cycle commands and (ii) generate pulse width modulated (PWM) commutation control signals based on the computed average.

In another embodiment, a high-integrity electromechanical actuator control system includes a system function controller, a plurality of actuator controllers, and at least one electromechanical actuator. The system function controller includes a plurality of redundant function control channels, and each function control channel is configured to supply digital actuator control commands. Each actuator controller is coupled to receive the digital actuator control commands supplied from at least two of the function control channels. Each actuator controller is configured, upon receipt of the actuator control commands, to implement a command voting scheme to verify actuator control command integrity and, upon verifying actuator control command integrity, to generate and supply analog actuator position commands. Each electromechanical actuator is coupled to receive the actuator position commands from at least one of the actuator controllers and is configured, upon receipt thereof, to actuate a device. Each actuator controller includes a first controller, a second controller, a duty cycle computation circuit, and a shut-off circuit. The first controller is coupled to receive the digital actuator control commands supplied from two of the function control channels and is configured, upon receipt thereof, to supply first digital duty cycle commands. The second controller is coupled to receive the digital actuator control commands supplied from two of the function control channels and is configured, upon receipt thereof, to supply second digital duty cycle commands. The duty cycle computation circuit coupled to receive the first digital duty cycle commands and the second digital duty cycle commands and is configured, upon receipt of the first and second duty cycle commands to (i) compute an average of the first and second duty cycle commands and (ii) generate pulse width modulated (PWM) commutation control signals based on the computed average. The shut-off circuit is in operable communication with the first controller, the second controller, and the duty cycle computation circuit, and is configured to selectively inhibit supply of the PWM commutation control signals.

In yet another embodiment, a high-integrity electromechanical actuator control system includes a system function controller, a plurality of actuator controllers, and at least one electromechanical actuator. The system function controller includes a plurality of redundant function control channels, and each function control channel is configured to supply digital actuator control commands. Each actuator controller is coupled to receive the digital actuator control commands supplied from at least two of the function control channels. Each actuator controller is configured, upon receipt of the actuator control commands, to implement a command voting scheme to verify actuator control command integrity and, upon verifying actuator control command integrity, to generate and supply analog actuator position commands. Each electromechanical actuator is coupled to receive the actuator position commands from at least one of the actuator controllers and is configured, upon receipt thereof, to actuate a device. Each actuator controller includes a first controller, a second controller, a duty cycle computation circuit, a motor driver, and a shut-off circuit. The first controller is coupled to receive the digital actuator control commands supplied from two of the function control channels and is configured, upon receipt thereof, to supply first digital duty cycle commands. The second controller is coupled to receive the digital actuator control commands supplied from two of the function control channels and is configured, upon receipt thereof, to supply second digital duty cycle commands. The duty cycle computation circuit coupled to receive the first digital duty cycle commands and the second digital duty cycle commands and is configured, upon receipt of the first and second duty cycle commands to (i) compute an average of the first and second duty cycle commands and (ii) generate pulse width modulated (PWM) commutation control signals based on the computed average. The shut-off circuit is in operable communication with the first controller, the second controller, and the duty cycle computation circuit, and is configured to selectively inhibit supply of the PWM commutation control signals. The motor driver is coupled to receive the PWM commutation control signals and is configured, upon receipt thereof, to supply multiphase motor drive current. The shut-off circuit is in operable communication with the first controller, the second controller, the duty cycle computation circuit, and the motor driver, and is configured to selectively inhibit supply of the PWM commutation control signals to the motor driver. The first controllers in each of the plurality of actuator controllers is dissimilar, the second controllers in each of the plurality of actuator controllers is dissimilar, and the duty cycle controllers in each of the plurality of actuator controllers is dissimilar.

Furthermore, other desirable features and characteristics of the high-integrity electromechanical actuator control system will become apparent from the subsequent detailed description and the appended claims, taken in conjunction with the accompanying drawings and the preceding background.

BRIEF DESCRIPTION OF DRAWINGS

The present disclosure will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Figure 1:
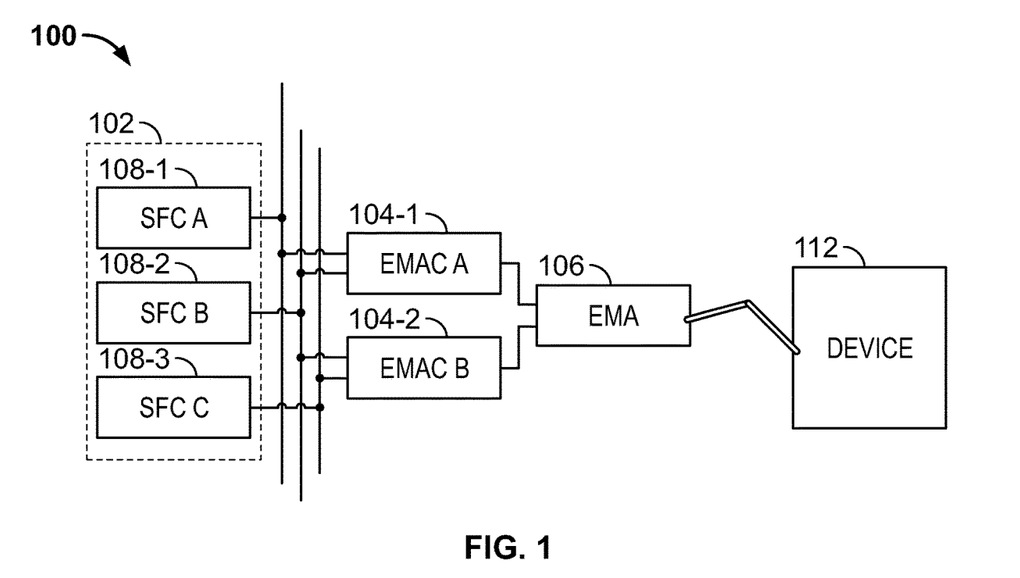
FIGS. 1-3 depict functional block diagrams of example embodiments of actuator control systems that implement various functional redundancy.
Figure 2:
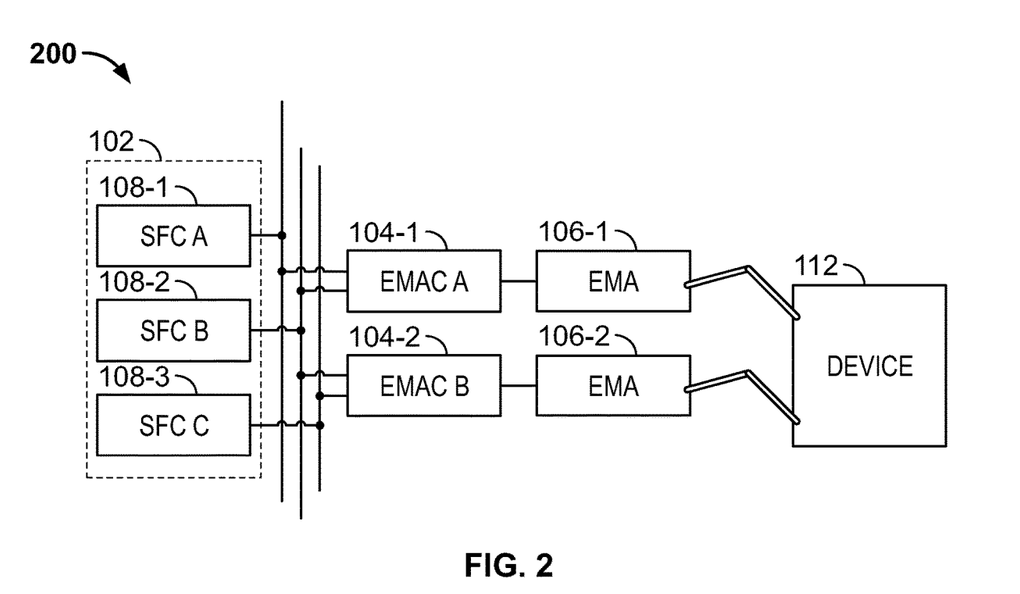
Figure 3:
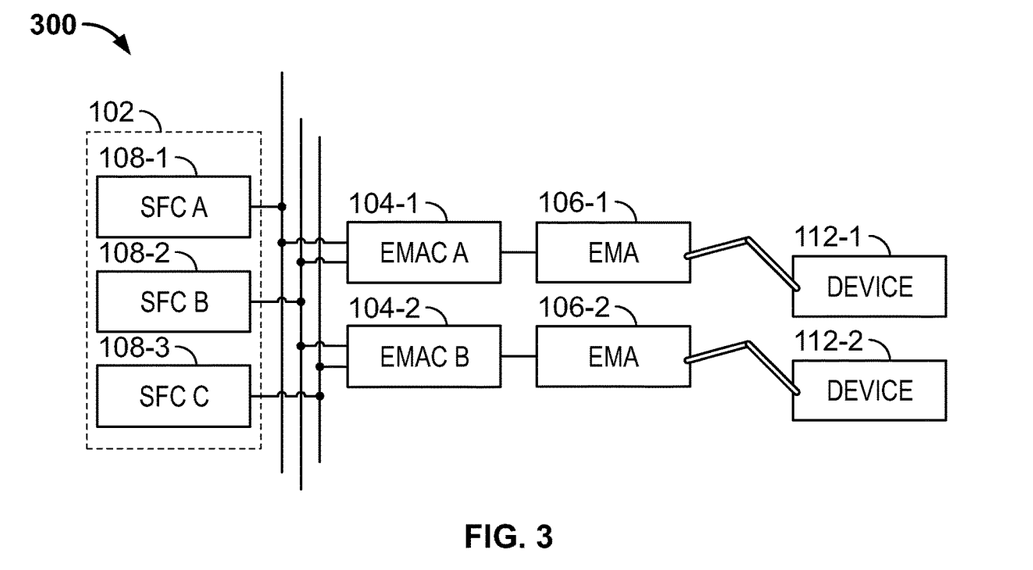

When it is required to prevent loss of control, it is assumed that system functional redundancy is required, either by multiple redundant control devices/systems (e.g., surfaces, engines, etc.) to achieve a given function, or by redundancy in the control of an individual devices/systems, to meet industry standards for flight critical systems. Some examples of embodiments actuator control systems that provide suitable system functional redundancy are depicted in FIGS. 1-3.

As depicted, each system 100, 200, 300 includes a system function controller (SFC) 102, a plurality of actuator controllers (EMACs) 104 (e.g., 104-1, 104-2), and at least one electromechanical actuator (EMA) 106. In each of the depicted embodiments, the system function controller 102 includes a plurality of redundant function control channels 108 (e.g., 108-1, 108-2, 108-3), each of which is configured to supply digital actuator control commands. Although the system function controllers 102 depicted in the embodiments of FIGS. 1-3 include three redundant function control channels 108, it will be appreciated that other embodiments may include more or less than this number of redundant function control channels 108. It will additionally be appreciated that the digital actuator control commands (which may be position and/or speed and/or direction) may be implemented using any one of numerous digital formats (e.g., CAN bus, ARINC bus, or other), and that the redundant function control channels 108 may be similar or dissimilar channels.

No matter the number of function control channels 108, each actuator controller 104 is coupled to receive the digital actuator control commands supplied from at least two of the function control channels 108. For example, in the depicted embodiments, one actuator controller 104-1 is coupled to receive the digital actuator control commands supplied from the first and second function control channels 108-1, 108-2, and the other actuator controller 104-2 is coupled to receive the digital actuator control commands supplied from the second and third function control channels 108-2, 108-3. It will be appreciated that in other embodiments, each actuator controller 104 may be coupled to receive the digital actuator control commands supplied from each of the function control channels 108.

Figure 4:
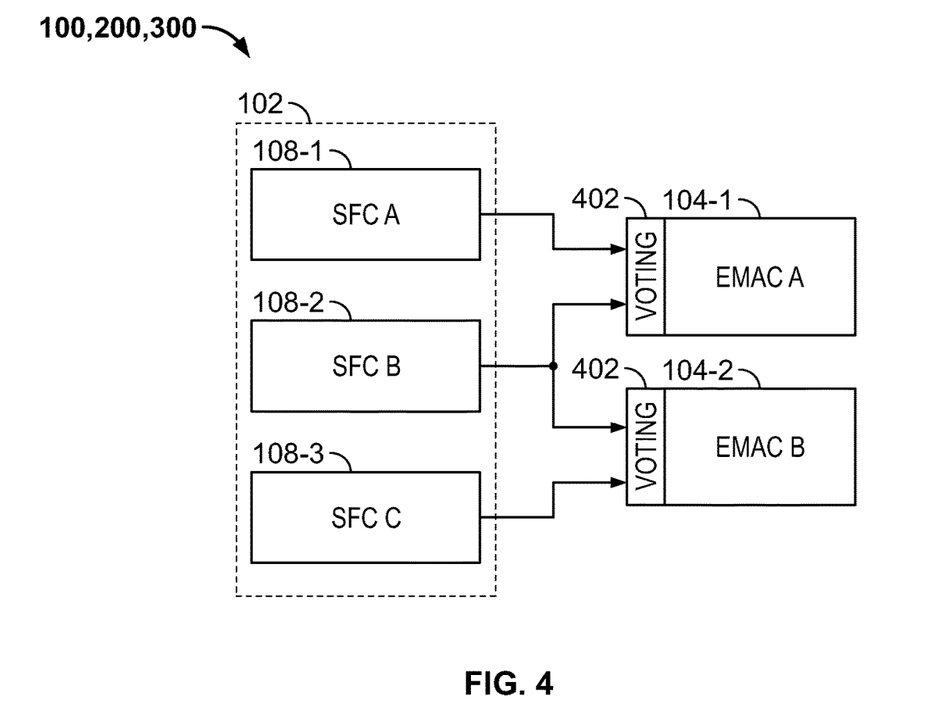
FIG. 4 depicts a functional block diagram of one embodiment of an actuator control system (without including the actuator or controlled object)

Regardless of which number of function control channels 108 that each actuator controller 104 receives the actuator control commands from, each actuator controller 104, as depicted more clearly in FIG. 4, is configured, upon receipt of the actuator control commands, to implement a command voting scheme 402. The command voting scheme 402, as is generally known, is used to verify actuator control command integrity. Upon verifying the actuator control command integrity, each actuator controller 104 is further configured to generate and supply analog actuator commands.

Returning to FIGS. 1-3, it was previously noted that each system 100 includes at least one electromechanical actuator 106. It was also previously noted that, to prevent loss of control, system functional redundancy is required to prevent loss of control. This redundancy can be implemented either by multiple redundant control devices (e.g., surfaces, engines, etc.) to achieve a given function or by redundancy in the control of an individual devices. The system 100 in FIG. 1 includes redundant actuator controllers 104-1, 104-2 controlling one electromechanical actuator 106 (which has separate motors), which in turn is used to actuate one device 112. The system 200 in FIG. 2 also includes redundant actuator controllers 104-1, 104-2 and redundant electromechanical actuators 106 (106-1, 106-2), which together are used to actuate one device 112. The system 300 in FIG. 3 includes redundant actuator controllers 104-1, 104-2 and redundant electromechanical actuators 106 (106-1, 106-2), each of which is used to actuate a separate, redundant device 112 (112-1, 112-2). No matter the number of electromechanical actuators 106, each is coupled to receive the actuator commands from at least one of the actuator controllers 104 and is configured, upon receipt thereof, to actuate a device 112

Figure 5:
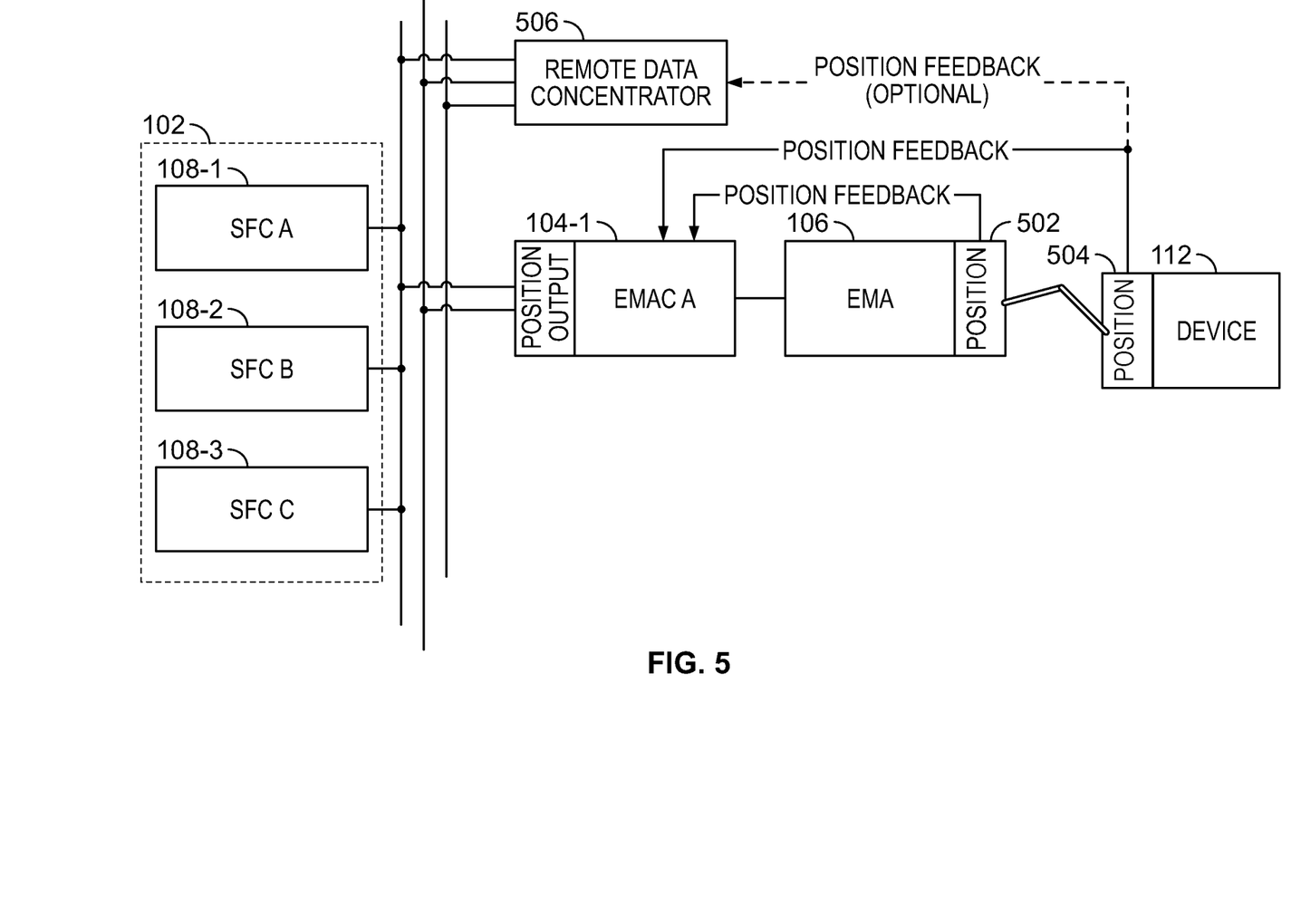
FIG. 5 depicts a more detailed functional block diagram of a portion of the system of FIG. 4 (including the actuator and controlled object)

Referring now to FIG. 5, it is seen that, in each system 100, 200, 300, each channel 108 of the system function controller 102 receives feedback of the actual position (and/or speed and/or direction) of the actuator(s) 106 and/or the actuated device(s) 112 to monitor that the command was successfully implemented. This monitoring is provided in the unlikely, yet postulated event that significant errors manifest over several computational iterations of the actuator controller 104 (such errors are postulated to lead to "hard-over" failures or persistent loss of control), not to prevent immediately occurring EMAC control errors at a high dynamic bandwidth. The system function controller 102, upon detecting erroneous control of the controlling actuator controller 104-1 (104-2), disables the controlling actuator controller 104-1 (104-2) from erroneously performing its function and enables the non-controlling actuator controller 104-2 (104-1).

The position (and/or speed and/or direction) feedback may be supplied from one or more actuator sensors 502 associated with each of the one or more actuators 106 and/or one or more device sensors 504 associated each of the one or more devices 112, via the controlling actuator controller 104-1 (104-2). In some embodiments, as FIG. 5 also depicts, the position (and/or speed and/or direction) feedback may be supplied from the one or more device sensors 504 associated each of the one or more devices 112, via a remote data concentrator 506.

Before proceeding further, it is noted that the actuator controllers 104 use a command-command (COM-COM) control method to provide high integrity actuator control, and thus prevent failure of one or the other command (COM) lanes from resulting in erroneous actuator control. This is because the other command (COM) lane compensates for the malfunction of the first command (COM) lane. This COM-COM architecture is industry proven and has been used to drive an open wound brushless DC motor through two parallel gate drivers and inverters, as described in U.S. Pat. No. 8,084,972 (published as U.S. Patent Application Publication No. 2009/0128072), which is assigned to the Assignee of the instant application, and which is hereby incorporated by reference.

Also described in U.S. Pat. No. 8,084,972 is the use of a "simplified" COM-COM architecture, where each command controllers' (COM) duty-cycle output is averaged with the other command controllers' (COM) duty-cycle output, and the resulting averaged duty-cycle is fed to the respective three phases of a gate driver/inverter to a single brushless DC motor.

Figure 6:
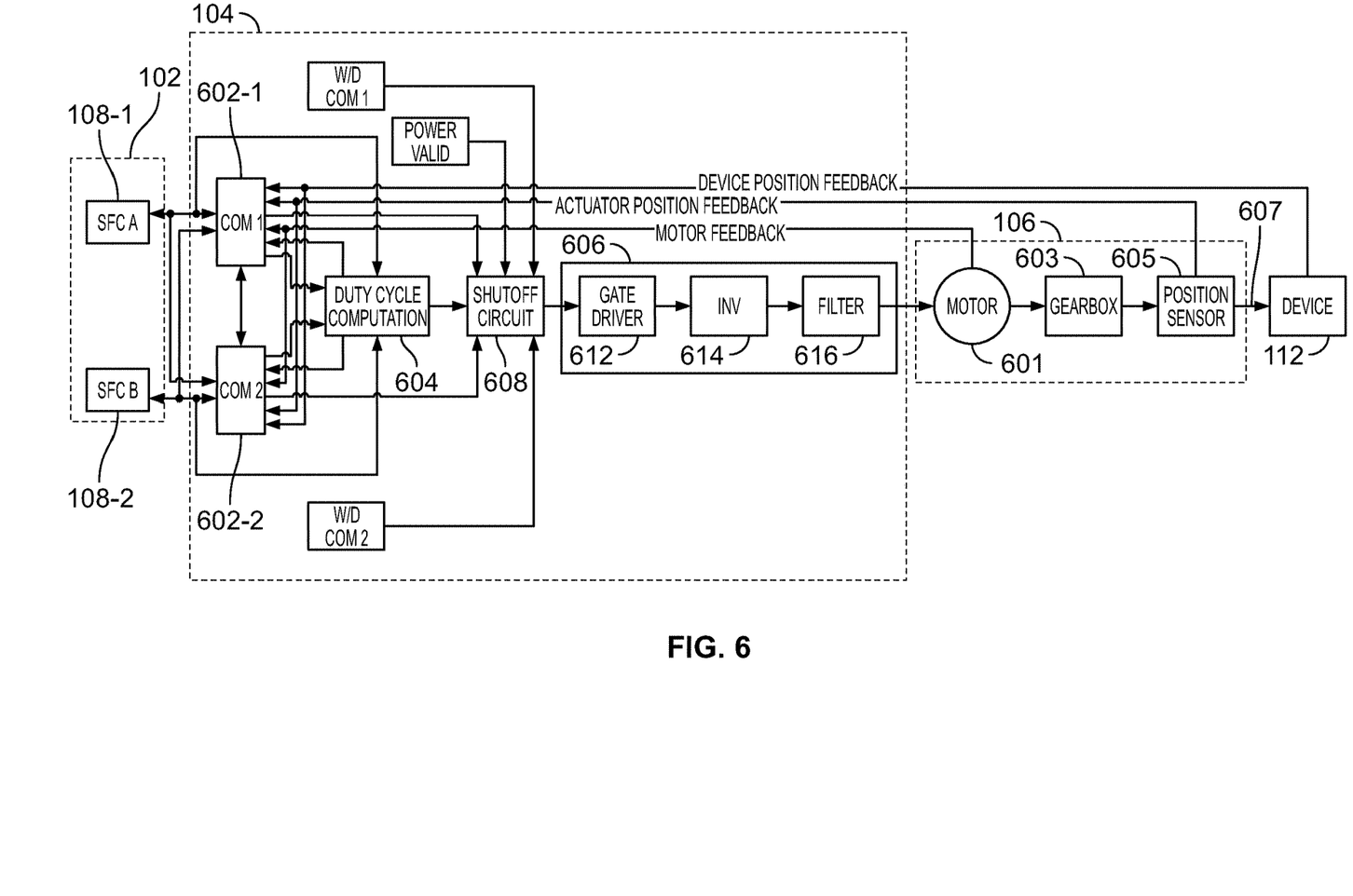
FIG. 6 is an even more detailed functional block diagram of one embodiment of an actuator control system.

With the above in mind, and with reference now to FIG. 6, a more detailed functional block diagram of one embodiment of one actuator controller 104 and an associated actuator 106 is depicted. As depicted therein, the actuator 106 includes an electric motor 601, a gearbox 603, a position sensor 605, and an actuation member 607 coupled to the device 112. The actuator 106 may be implemented using any one of numerous known electromechanical actuator configurations. As such, a detailed description thereof is not needed or provided.

Figure 7:
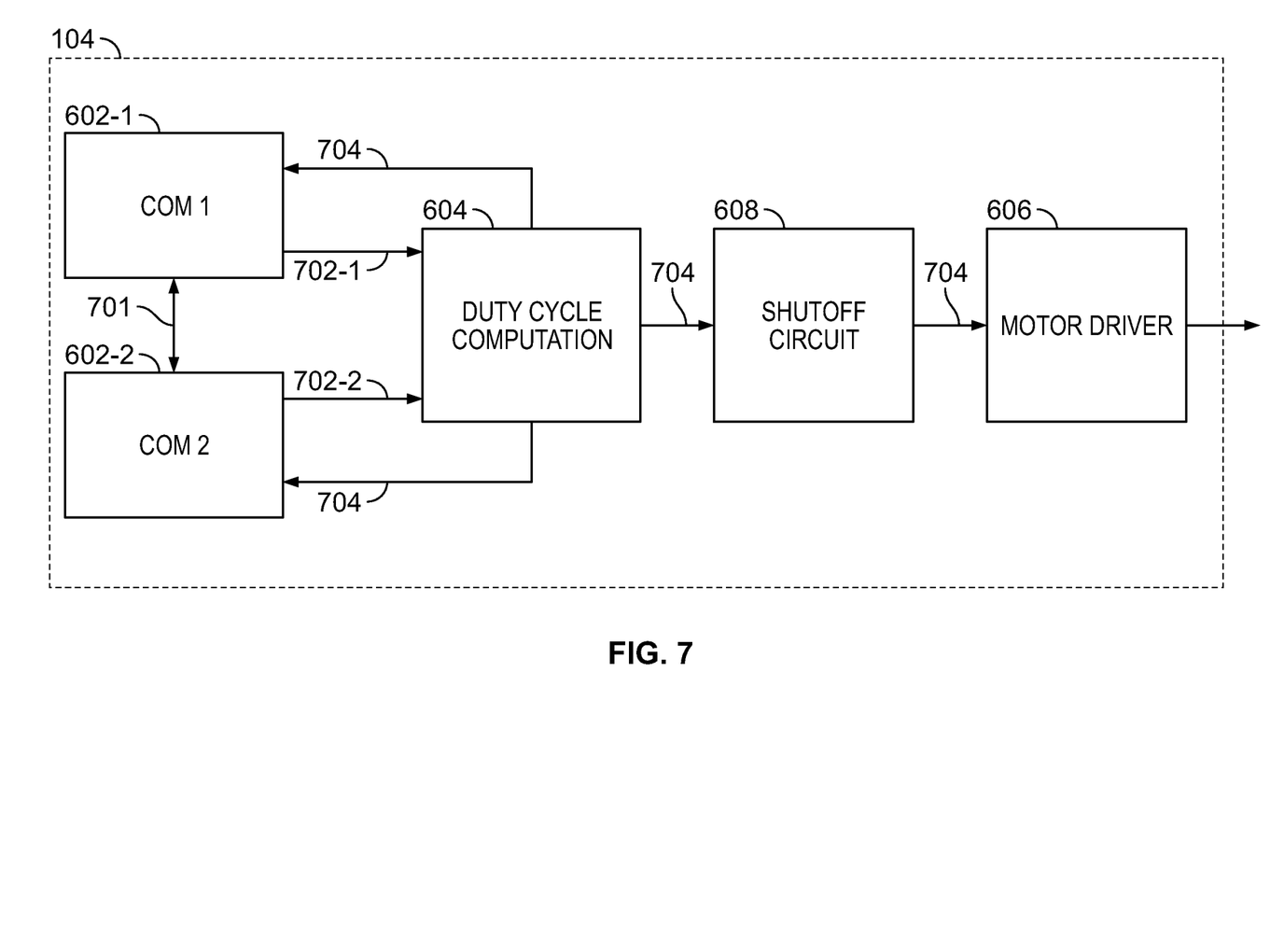
FIGS. 7 and 8 depict portions of the actuator control system of FIG. 6 in isolation.

Turning to the actuator controller 104, it includes at least a first controller 602-1, a second controller 602-2, a duty cycle computation circuit 604, a motor driver 606, and a shut-off circuit 608. The first and second controllers 602-1, 602-2 implement a simplified command-command (COM- COM) architecture (see above). More specifically, the first controller 602-1 is coupled to receive the digital actuator control commands supplied from two of the function control channels 108 and is configured, upon receipt thereof, to supply first digital duty cycle commands (in a binary or other digital form) 702-1 (see FIG. 7). The second controller 602-2 is also coupled to receive the digital actuator control commands supplied from two of the function control channels 108 and is configured, upon receipt thereof, to supply second digital duty cycle commands (in a binary or other digital form) 702-2 (FIG. 7).

It will be appreciated that the first and second controllers 602-1, 602-2, which may also be referred to herein as COM-COM controllers, may be implemented using two separate, individual microcontrollers (as shown in FIG. 6) or as a single device embedded with dual controller cores that can operate independently or in lockstep manner. In either case, the first and second controllers 602-1, 602-2 are preferably identical in design and software to reduce development costs.

The duty cycle computation circuit 604 is coupled to receive the first digital duty cycle commands 702-1 and the second digital duty cycle commands 702-2. The duty cycle computation circuit 604 is configured, upon receipt of the first and second duty cycle commands 702-1, 702-2 to compute an average of the first and second duty cycle commands and, based on the computed average, to generate pulse width modulated (PWM) commutation control signals 704 indicative of the computed average. It will be appreciated that the duty cycle computation circuit 604 may be variously implemented. In the depicted embodiment, however, it is implemented using a field programmable gate array (FPGA) (or similar) device. No matter how it is specifically implemented, the digital duty cycle computation circuit 604 is independent from the first and second controllers 602-1, 602-2, and therefore is not susceptible to the same possible common mode failures as the first and second controllers 602-1, 602-2.

The motor driver 606 is coupled to receive the PWM commutation control signals and is configured, upon receipt of the commutation control signals, to supply multi-phase motor drive current to the motor 601 using known techniques. Although the motor driver 606 may be variously implemented to carry out this function, in the depicted embodiment, it includes at least a gate driver circuit 612 and an inverter circuit 614. The motor driver 606, at least in the depicted embodiment, may also include a suitable filter circuit 616.

As FIG. 6 depicts, and as FIG. 7 depicts even more clearly, it is seen that the pulse width modulated (PWM) commutation control signals, which are indicative of the computed average of the first and second duty cycle commands, are fed back to the first and second controllers 602-1, 602-2. This is done so that each of the first and second controllers 602-1, 602-2 can confirm the operability of the duty cycle computation circuit 604 by confirming that the duty cycle computation circuit 604 properly converted the duty cycle commands 702-1, 702-2 into the PWM commutation control signals. To do so, and as FIGS. 6 and 7 further depict, the first and second controllers 602-1, 602-2 are in operable communication 701 (FIG. 7). This is so that each controller 602-1, 602-2 can provide the duty cycle commands 702-1, 702-2 it supplied to the duty cycle computation circuit 604 to the other controller 602-2, 602-1. The first and second controllers 602-1, 602-2 are each further configured to mathematically subtract the other controller's duty cycle commands 702-1, 702-2 from the pulse width modulated (PWM) commutation control signals 704, to thereby detect if the duty cycle computation circuit 604 properly converted its duty cycle commands into the PWM commutation control signals. More specifically, the first controller 602-1 mathematically subtracts the duty cycle commands 702-2 supplied by the second controller 602-2 from the PWM commutation control signals 704 to determine if the duty cycle computation circuit 604 properly converted its duty cycle commands 702-1 into the PWM commutation control signals 704, and the second controller 602-2 mathematically subtracts the duty cycle commands 702-1 supplied by the first controller 602-1 from the PWM commutation control signals 704 to determine if the duty cycle computation circuit 604 properly converted its duty cycle commands 702-2 into the PWM commutation control signals 704.

The shut-off circuit 608 is in operable communication with the first controller 602-1, the second controller 602-2, and the duty cycle computation circuit 604. The shut-off circuit 608, which is independent of the first and second controllers 602-1, 602-2 and the duty cycle computation circuit 604, is configured, using known techniques, to selectively inhibit supply of the PWM commutation control signals 704 to the motor driver 606. More specifically, and as shown more clearly in FIG. 8, in the unlikely event that either or both controllers 602-1, 602-2 detect a failure of the duty cycle computation circuit 604 to properly convert its duty cycle commands into the PWM commutation control signals, the shut-of circuit 608 will be supplied with one or more shut-off commands. The shut-off circuit 608, in response to the one or more shut-off commands, will inhibit the supply of the PWM commutation control signals to the motor driver 606. As may be readily appreciated, if the first controller 602-1 detects the failure, it will supply a first shut-off command 802-1 (FIG. 8), if the second controller 602-2 detects the failure, it will supply a second shut-off command 802-2 (FIG. 8), and if both controllers 602-1, 602-2 detect the failure, the shut-off circuit 608 will receive the first and second shut-off commands 802-1, 802-2.

Figure 8:
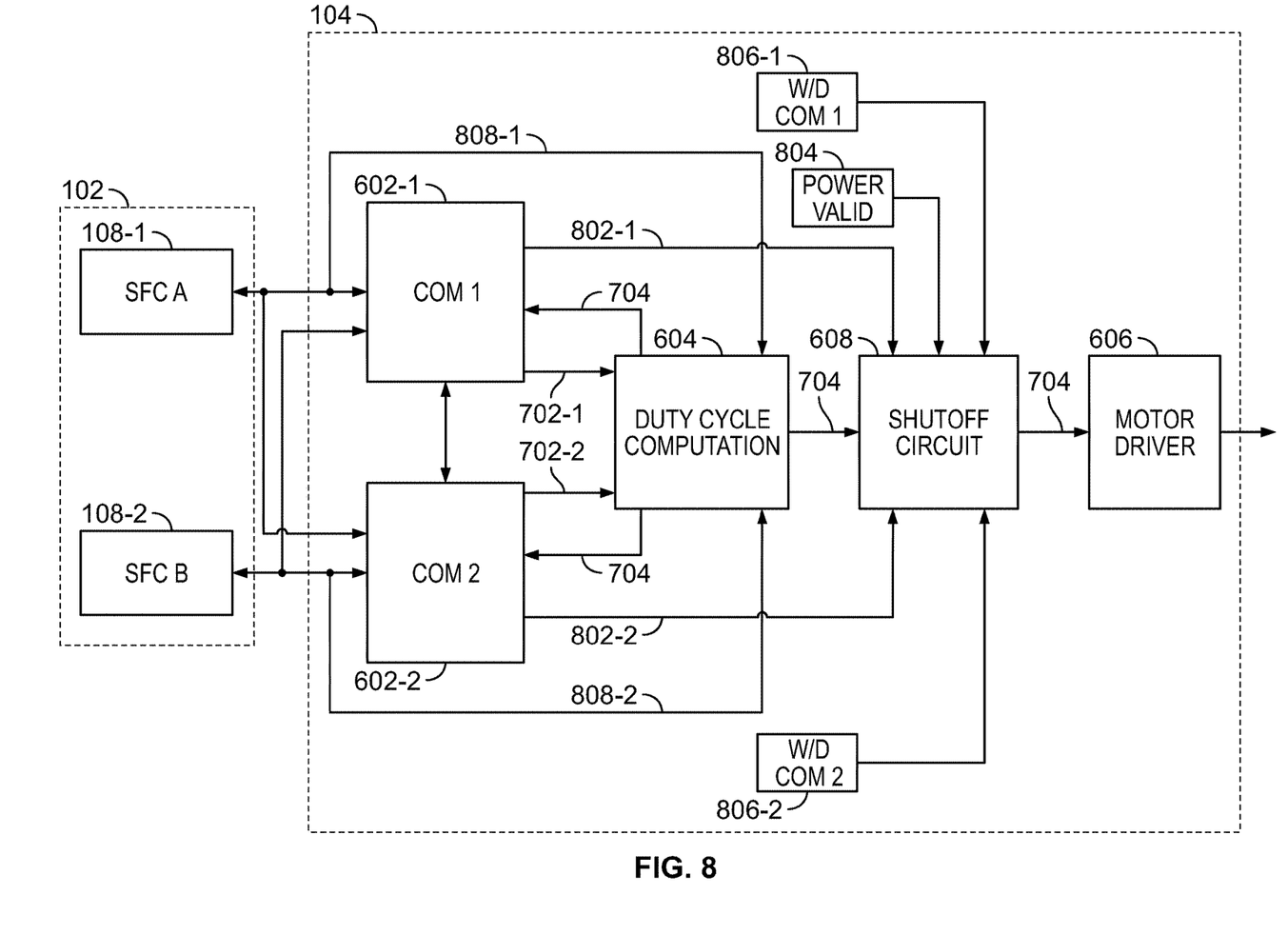

As FIGS. 6 and 8 also depict, the shut-off circuit 608, at least in the depicted embodiment, is also configured to inhibit the supply of the PWM commutation control signals to the motor driver 606 should two other unlikely events occur. One of the unlikely events is a hardware detected power invalid condition 804 (FIG. 8) that could potentially cause a controller hardware or software failure. The other unlikely event is a hardware detected, real-time software computational overrun (e.g., "watchdog" overrun) 806-1, 806-2 (FIG. 8) in either or both of the first or second controllers 602-1, 602-2.

In addition to the above, and as FIGS. 6 and 8 further depict, it is seen that, at least in the depicted embodiment, the individual function control channels 108 may supply a function control channel shut-off command 808-1, 808-2 (FIG. 8) to the duty cycle computation circuit 604. Such a command is supplied in the unlikely event the system function controller 102 detects a malfunction that was caused by a common mode failure of the first and second controllers 602-1, 602-2.

Figure 9:
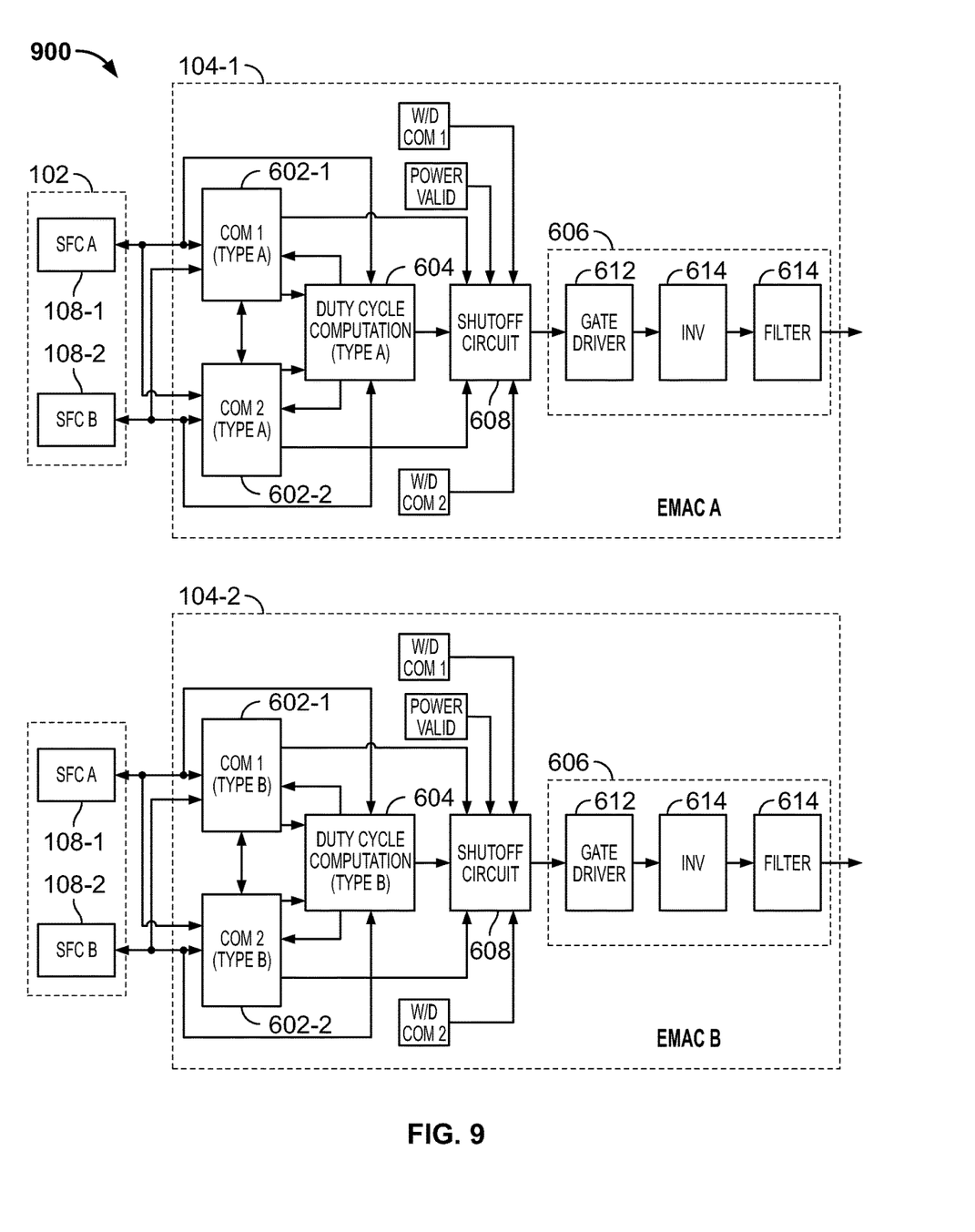
FIG. 9 depicts a functional block diagram of a dual-channel actuator control system, using redundant, dissimilar actuator controllers.

Turning now to FIG. 9, a functional block diagram of another embodiment of a dual-channel, high-integrity electromechanical actuator control system 900 is depicted. This system 900 is functionally and identical to the systems 100, 200, 300 already described, but is implemented using redundant, dissimilar actuator controllers 104. In the depicted embodiment, dissimilarity is accomplished only with devices that are classified as "complex" (as defined in AC/AMC 20-152A). Thus, not every component in the first and second actuator controllers 104-1, 104-2 (simple and complex) must be dissimilar. This provides a defined scope limitation for the design that is defendable with certification authorities.

In the depicted embodiment, the first and second controllers 602-1, 602-2 and the duty cycle computation circuit 604 are considered "complex" and are thus dissimilar between the first and second actuator controllers 104-1, 104-2. Specifically, in the first actuator controller 104-1, the first and second controllers 602-1, 602-1 are both labeled as (TYPE A), and in the second actuator controller 104-2, the first and second controllers 602-1, 602-2 are both labeled as (TYPE B). Similarly, the duty cycle computation circuit 604 in the first actuator controller 104-1 is labeled as (TYPE A), and the duty cycle computation circuit 604 in second actuator controller 104-2 is labeled as (TYPE B).

Because the first and second controllers 602-1, 602-2 and the duty cycle computation circuit 604 are different TYPES (TYPE A versus TYPE B), and because the interface circuitry and power requirements may be different between the TYPE A and the TYPE B devices, this will necessitate unique circuit design around the perimeter of each of these devices, resulting in further dissimilarity. Because the first and second controllers 602-1, 602-2 and the duty cycle computation circuit 604 must be significantly different (between the first and second actuator controllers 104-1, 104-2), the core development tools/compilers and low-level software and circuit design provide dissimilar object code (software or microcode) in the implemented design. It should be noted that non-complex devices ("simple" devices as defined in AC/AMC 20-152A) may be dissimilar between the first and second actuator controllers 104-1, 104-2, for other purposes, but they are not required to be dissimilar for the purposes of common mode failure consideration.

The systems described herein may be used on multiple flight control, electric motor tilt, and motor propeller pitch actuation systems; or any other critical aircraft systems requiring electromechanical actuation.

The systems described herein satisfy aircraft certification criteria and provide an efficient weight and cost system and equipment design, with a clever application of redundancy, command and monitoring function, dissimilarity, and independence between and within the EMACs.

The systems described herein differ from previously known architectures, and removes significant actuator controller cost, size, and weight, by using a simplified COM-COM approach, and not two completely redundant inverters in the same actuator controller, and by not using open end wound (OEW) motors.

Those of skill in the art will appreciate that the various illustrative logical blocks, modules, circuits, and algorithm steps described in connection with the embodiments disclosed herein may be implemented as electronic hardware, computer software, or combinations of both. Some of the embodiments and implementations are described above in terms of functional and/or logical block components (or modules) and various processing steps. However, it should be appreciated that such block components (or modules) may be realized by any number of hardware, software, and/or firmware components configured to perform the specified functions. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, or organic properties corresponding to the data bits. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or instructions that perform the various tasks. The program or code segments can be stored in a processor-readable medium or transmitted by a computer data signal embodied in a carrier wave over a transmission medium or communication path. The "computer-readable medium", "processor-readable medium", or "machine-readable medium" may include any medium that can store or transfer information. Examples of the processor-readable medium include an electronic circuit, a semiconductor memory device, a ROM, a flash memory, an erasable ROM (EROM), a floppy diskette, a CD-ROM, an optical disk, a hard disk, a fiber optic medium, a radio frequency (RF) link, or the like. The computer data signal may include any signal that can propagate over a transmission medium such as electronic network channels, optical fibers, air, electromagnetic paths, or RF links. The code segments may be downloaded via computer networks such as the Internet, an intranet, a LAN, or the like.

Some of the functional units described in this specification have been referred to as "modules" in order to more particularly emphasize their implementation independence. For example, functionality referred to herein as a module may be implemented wholly, or partially, as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like. Modules may also be implemented in software for execution by various types of processors. An identified module of executable code may, for instance, comprise one or more physical or logical modules of computer instructions that may, for instance, be organized as an object, procedure, or function. Nevertheless, the executables of an identified module need not be physically located together, but may comprise disparate instructions stored in different locations that, when joined logically together, comprise the module and achieve the stated purpose for the module. Indeed, a module of executable code may be a single instruction, or many instructions, and may even be distributed over several different code segments, among different programs, and across several memory devices. Similarly, operational data may be embodied in any suitable form and organized within any suitable type of data structure. The operational data may be collected as a single data set, or may be distributed over different locations including over different storage devices, and may exist, at least partially, merely as electronic signals on a system or network.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A high-integrity electromechanical actuator control system, comprising:
    a system function controller comprising a plurality of redundant function control channels, each function control channel configured to supply digital actuator control commands;
    a plurality of actuator controllers, each actuator controller coupled to receive the digital actuator control commands supplied from at least two of the function control channels, each actuator controller configured, upon receipt of the digital actuator control commands, to implement a command voting scheme to verify digital actuator control command integrity and, upon verifying digital actuator control command integrity, to generate and supply multi-phase motor drive current; and
    at least one electromechanical actuator coupled to receive the multi-phase motor drive current from at least one of the actuator controllers and configured, upon receipt thereof, to actuate a device,
    wherein each actuator controller comprises:
        a first controller coupled to receive the digital actuator control commands supplied from two of the function control channels and configured, upon receipt thereof, to supply first digital duty cycle commands;
        a second controller coupled to receive the digital actuator control commands supplied from two of the function control channels and configured, upon receipt thereof, to supply second digital duty cycle commands;
        a duty cycle computation circuit coupled to receive the first digital duty cycle commands and the second digital duty cycle commands and configured, upon receipt of the first digital duty cycle commands and the second digital duty cycle commands to (i) compute an average of the first digital duty cycle commands and the second digital duty cycle commands and (ii) generate pulse width modulated (PWM) commutation control signals based on the computed average; and
        a motor driver coupled to receive the PWM commutation control signals and configured, upon receipt thereof, to supply the multi-phase motor drive current.

2. The system of claim 1, wherein the motor driver comprises a gate driver circuit and an inverter circuit.

3. The system of claim 2, wherein the motor driver further comprises a filter circuit.

4. The system of claim 1, wherein:
the first controller is coupled to receive the second digital duty cycle commands and the PWM commutation control signals and is configured, upon receipt of the second digital duty cycle commands and the PWM commutation control signals, to confirm operability of the duty cycle computation circuit by mathematically subtracting the second digital duty cycle signals from the PWM commutation control signals; and
the second controller is coupled to receive the first digital duty cycle commands and the PWM commutation control signals and is configured, upon receipt of the first digital duty cycle commands and the PWM commutation control signals, to confirm operability of the duty cycle computation circuit by mathematically subtracting the first digital duty cycle signals from the PWM commutation control signals.

5. The system of claim 4, wherein each actuator controller further comprises:
a shut-off circuit in operable communication with the first controller, the second controller, and the duty cycle computation circuit, the shut-off circuit configured to selectively inhibit supply of the PWM commutation control signals.

6. The system of claim 5, wherein:
the first controller supplies a first shut-off command to the shut-off circuit when it does not confirm operability of the duty cycle computation circuit;
the second controller supplies a second shut-off command to the shut-off circuit when it does not confirm operability of the duty cycle computation circuit; and
the shut-off circuit is configured, upon receipt of the first shut-off command and/or the second shut-off command, to inhibit supply of the PWM commutation control signals.

7. The system of claim 1, wherein the duty cycle computation circuit comprises a field programmable gate array device.

8. The system of claim 1, wherein:
the first controllers in each of the plurality of actuator controllers is dissimilar;
the second controllers in each of the plurality of actuator controllers is dissimilar; and
the duty cycle controllers in each of the plurality of actuator controllers is dissimilar.

9. A high-integrity electromechanical actuator control system, comprising:
a system function controller comprising a plurality of redundant function control channels, each function control channel configured to supply digital actuator control commands;
a plurality of actuator controllers, each actuator controller coupled to receive the digital actuator control commands supplied from at least two of the function control channels, each actuator controller configured, upon receipt of the digital actuator control commands, to implement a command voting scheme to verify digital actuator control command integrity and, upon verifying digital actuator control command integrity, to generate and supply multi-phase motor drive current; and
at least one electromechanical actuator coupled to receive the multi-phase motor drive current from at least one of the actuator controllers and configured, upon receipt thereof, to actuate a device,
wherein each actuator controller comprises:
a first controller coupled to receive the digital actuator control commands supplied from two of the function control channels and configured, upon receipt thereof, to supply first digital duty cycle commands;
a second controller coupled to receive the digital actuator control commands supplied from two of the function control channels and configured, upon receipt thereof, to supply second digital duty cycle commands;
a duty cycle computation circuit coupled to receive the first digital duty cycle commands and the second digital duty cycle commands and configured, upon receipt of the first digital duty cycle commands and the second digital duty cycle commands to (i) compute an average of the first digital duty cycle commands and the second digital duty cycle commands and (ii) generate pulse width modulated (PWM) commutation control signals based on the computed average;
a motor driver coupled to receive the PWM commutation control signals and configured, upon receipt thereof, to supply the multi-phase motor drive current; and
a shut-off circuit in operable communication with the first controller, the second controller, and the duty cycle computation circuit, the shut-off circuit configured to selectively inhibit supply of the PWM commutation control signals.

10. The system of claim 9, wherein the motor driver comprises a gate driver circuit, an inverter circuit, and a filter circuit.

11. The system of claim 9, wherein:
the first controller is coupled to receive the second digital duty cycle commands and the PWM commutation control signals and is configured, upon receipt of the second digital duty cycle commands and the PWM commutation control signals, to confirm operability of the duty cycle computation circuit by mathematically subtracting the second digital duty cycle signals from the PWM commutation control signals; and
the second controller is coupled to receive the first digital duty cycle commands and the PWM commutation control signals and is configured, upon receipt of the first digital duty cycle commands and the PWM commutation control signals, to confirm operability of the duty cycle computation circuit by mathematically subtracting the first digital duty cycle signals from the PWM commutation control signals,
wherein:
the first controller supplies a first shut-off command to the shut-off circuit when it does not confirm operability of the duty cycle computation circuit;
the second controller supplies a second shut-off command to the shut-off circuit when it does not confirm operability of the duty cycle computation circuit; and
the shut-off circuit is configured, upon receipt of the first shut-off command and/or the second shut-off command, to inhibit supply of the PWM commutation control signals.

12. A high-integrity electromechanical actuator control system, comprising:

a system function controller comprising a plurality of redundant function control channels, each function control channel configured to supply digital actuator control commands;

a plurality of actuator controllers, each actuator controller coupled to receive the digital actuator control commands supplied from at least two of the function control channels, each actuator controller configured, upon receipt of the digital actuator control commands, to implement a command voting scheme to verify digital actuator control command integrity and, upon verifying digital actuator control command integrity, to generate and supply multi-phase motor drive current; and at least one electromechanical actuator coupled to receive the multi-phase motor drive current from at least one of the actuator controllers and configured, upon receipt thereof, to actuate a device, wherein each actuator controller comprises:

a first controller coupled to receive the digital actuator control commands supplied from two of the function control channels and configured, upon receipt thereof, to supply first digital duty cycle commands;

a second controller coupled to receive the digital actuator control commands supplied from two of the function control channels and configured, upon receipt thereof, to supply second digital duty cycle commands;

a duty cycle computation circuit coupled to receive the first digital duty cycle commands and the second digital duty cycle commands and configured, upon receipt of the first digital duty cycle commands and the second digital duty cycle commands to (i) compute an average of the first digital duty cycle commands and the second digital duty cycle commands and (ii) generate pulse width modulated (PWM) commutation control signals based on the computed average;

a motor driver coupled to receive the PWM commutation control signals and configured, upon receipt thereof, to supply the multi-phase motor drive current; and a shut-off circuit in operable communication with the first controller, the second controller, the duty cycle computation circuit, and the motor driver, the shut-off circuit configured to selectively inhibit supply of the PWM commutation control signals to the motor driver, wherein:

the first controllers in each of the plurality of actuator controllers is dissimilar;

the second controllers in each of the plurality of actuator controllers is dissimilar; and the duty cycle controllers in each of the plurality of actuator controllers is dissimilar.

13. The system of claim 10, wherein:

the first controller is coupled to receive the second digital duty cycle commands and the PWM commutation control signals and is configured, upon receipt of the second digital duty cycle commands and the PWM commutation control signals, to confirm operability of the duty cycle computation circuit by mathematically subtracting the second digital duty cycle signals from the PWM commutation control signals; and the second controller is coupled to receive the first digital duty cycle commands and the PWM commutation control signals and is configured, upon receipt of the first digital duty cycle commands and the PWM commutation control signals, to confirm operability of the duty cycle computation circuit by mathematically subtracting the first digital duty cycle signals from the PWM commutation control signals.

14. The system of claim 12, wherein:

the first controller supplies a first shut-off command to the shut-off circuit when it does not confirm operability of the duty cycle computation circuit;

the second controller supplies a second shut-off command to the shut-off circuit when it does not confirm operability of the duty cycle computation circuit; and the shut-off circuit is configured, upon receipt of the first shut-off command and/or the second shut-off command, to inhibit supply of the PWM commutation control signals.

15. The system of claim 12, wherein the duty cycle computation circuit comprises a field programmable gate array device.

* * * * *

UNITED STATES PATENT AND TRADEMARK OFFICE
CERTIFICATE OF CORRECTION

PATENT NO.       : 12,244,258 B2
APPLICATION NO.  : 18/152803
DATED            : March 4, 2025
INVENTOR(S)      : Horner et al.

Page 1 of 1

It is certified that error appears in the above-identified patent and that said Letters Patent is hereby corrected as shown below:

In the Claims

Column 16, Line 12 (Claim 13), change "10" to 12.

Signed and Sealed this
Sixth Day of May, 2025

Coke Morgan Stewart
*Acting Director of the United States Patent and Trademark Office*